United States Patent
Saito et al.

(10) Patent No.: US 10,823,783 B2
(45) Date of Patent: Nov. 3, 2020

(54) MOTOR DRIVE DEVICE HAVING FAILURE DETECTION FUNCTION

(71) Applicant: FANUC CORPORATION, Yamanashi (JP)

(72) Inventors: Sou Saito, Yamanashi (JP); Tsutomu Shikagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/157,567

(22) Filed: Oct. 11, 2018

(65) Prior Publication Data

US 2019/0113576 A1 Apr. 18, 2019

(30) Foreign Application Priority Data

Oct. 12, 2017 (JP) .................................. 2017-198612

(51) Int. Cl.
*G01R 31/34* (2020.01)
*H02P 3/18* (2006.01)
(Continued)

(52) U.S. Cl.
CPC .............. *G01R 31/343* (2013.01); *H02P 3/18* (2013.01); *H02P 3/22* (2013.01); *H02P 27/06* (2013.01); *H02P 29/0241* (2016.02)

(58) Field of Classification Search
CPC .......... G01R 31/343; H02P 27/06; H02P 3/18
See application file for complete search history.

(56) References Cited

U.S. PATENT DOCUMENTS

2009/0174349 A1 7/2009 Iwashita et al.
2016/0226407 A1* 8/2016 Saitou ...................... H02P 3/22
(Continued)

FOREIGN PATENT DOCUMENTS

CN 101483402 A 7/2009
CN 102315817 A 1/2012
(Continued)

OTHER PUBLICATIONS

English Abstract and Machine Translation for Japanese Publication No. 2004-350387 A, published Dec. 9, 2004, 16 pgs.
(Continued)

*Primary Examiner* — Kawing Chan
*Assistant Examiner* — Bradley R Brown
(74) *Attorney, Agent, or Firm* — Fredrikson & Byron, P.A.

(57) ABSTRACT

A motor drive device includes an inverter configured to convert a DC voltage to an AC voltage by switching power devices, a current detector configured to detect a current output from the inverter, a current controller configured to generate a voltage command, a control signal generator configured to control switching of the power devices, a dynamic brake circuit provided with relays and configured to short-circuit an output side terminal of the inverter via resistances, a storage configured to store an initial current value and a first threshold value, and a failure determiner configured to compare a current value and an initial current value after a predetermined time has elapsed since detection of the initial current value, and determine presence or absence of a failure based on a result of comparing a change rate of the current value from the initial current value with the first threshold value.

7 Claims, 6 Drawing Sheets

(51) Int. Cl.
*H02P 27/06* (2006.01)
*H02P 29/024* (2016.01)
*H02P 3/22* (2006.01)

(56) References Cited

U.S. PATENT DOCUMENTS

| | | | | |
|---|---|---|---|---|
| 2017/0353127 | A1* | 12/2017 | Kouno | H02M 7/493 |
| 2018/0237058 | A1* | 8/2018 | Furukawa | B62D 5/0403 |
| 2018/0323613 | A1* | 11/2018 | Fujimoto | H02P 27/06 |

FOREIGN PATENT DOCUMENTS

| | | | |
|---|---|---|---|
| CN | 105099330 | A | 11/2015 |
| CN | 105846756 | A | 8/2016 |
| CN | 107078681 | A | 8/2017 |
| DE | 102016101075 | A1 | 8/2016 |
| EP | 3366548 | A1 | 8/2018 |
| JP | S59061402 | A | 4/1984 |
| JP | 200137284 | A | 2/2001 |
| JP | 2004350387 | A | 12/2004 |
| JP | 2009165296 | A | 7/2009 |
| JP | 2013212760 | A | 10/2013 |
| WO | 2017122309 | A1 | 7/2017 |

OTHER PUBLICATIONS

English Abstract and Machine Translation for Japanese Publication No. 2009-165296 A, published Jul. 23, 2009, 26 pgs.
English Abstract and Machine Translation for Japanese Publication No. 2001-037284 A, published Feb. 9, 2001, 45 pgs.
English Abstract and Machine Translation for Chinese Publication No. 101483402 A, published Jul. 15, 2009, 7 pgs.
English Machine Translation for International Publication No. 20171122309 A1, published Jul. 20, 2017, 12 pgs.
English Abstract and Machine Translation for Chinese Publication No. 105846756 A, published Aug. 10, 2016, 7 pgs.
English Abstract and Machine Translation for Chinese Publication No. 105099330 A, published Nov. 25, 2015, 11 pgs.
English Abstract and Machine Translation for Chinese Publication No. 107078681 A, published Aug. 18, 2017, 13 pgs.
English Abstract and Machine Translation for Chinese Publication No. 102315817 A, published Jan. 11, 2012, 11 pgs.
English Abstract and Machine Translation for Japanese Publication No. 2013-212760 A, published Oct. 17, 2013, 24 pgs.
English Abstract and Machine Translation for Japanese Publication No. JPS59-061402 A, published Apr. 7, 1984, 5 pgs.
English Abstract and Machine Translation for German Publication No. DE 102016101075 A1, published Aug. 4, 2016, 9 pgs.

* cited by examiner

MOTOR DRIVE DEVICE HAVING FAILURE DETECTION FUNCTION

This application is a new U.S. patent application that claims benefit of JP 2017-198612 filed on Oct. 12, 2017, the content of JP 2017-198612 is incorporated herein by reference.

BACKGROUND OF THE INVENTION

1. Field of the Invention

The present invention relates to a motor drive device, and more particularly relates to a motor drive device having a failure detection function.

2. Description of the Related Art

In the motor control device, a current controller which receives a current command sends a control signal for controlling (turning on/off) a power device to the power device, and controls the motor current to drive the motor. Further, a current detection circuit detects the motor current and feeds it back to the current controller, by which the current command and the actual motor current are compared, the current command is adjusted, and the control signal is adjusted.

In a case where any one of the power device, the motor, or the current detection circuit fails, the motor cannot be properly controlled, and problems may arise in which the motor performs abnormally.

Accordingly, methods of utilizing current fed back from a current detection circuit to detect failures or predict failures have been reported (for example, Japanese Unexamined Patent Publication (Kokai) No. JP 2004-350387 A).

SUMMARY OF THE INVENTION

However, in the related art, there is a problem that failures cannot be detected unless the motor is actually operated. Further, as no feedback current is generated unless the motor is connected to a motor drive device, there is a problem that failures cannot be detected in the motor drive device alone.

A motor drive device according to an example of the present disclosure includes an inverter provided with a plurality of power devices and configured to convert a direct current (DC) voltage to an alternative current (AC) voltage by switching the plurality of power devices; a current detector configured to detect a current output from the inverter; a current controller configured to generate a voltage command based on a current command and a value of the current detected by the current detector; a control signal generator configured to control switching of the plurality of power devices of the inverter based on the voltage command; a dynamic brake circuit provided with a plurality of relays and configured to short-circuit an output side terminal of the inverter via a plurality of resistances; a storage configured to store, when a current command is input to the current controller and at least two relays from among the plurality of relays are caused to conduct, an initial current value being an initial value of a current detected by the current detector and a first threshold value for determining presence or absence of a failure; and a failure determiner configured to compare, after a predetermined time has elapsed since detection of the initial current value, a current value and the initial current value, and determine presence or absence of a failure based on a result of comparing a change rate of the current value from the initial current value with the first threshold value, wherein the current value is a value of a current detected by the current detector when a current command is input to the current controller and at least two relays from among the plurality of relays are caused to conduct.

BRIEF DESCRIPTION OF THE DRAWINGS

The objects, features and advantages of the present invention will become more apparent from the following description of the embodiments in connection with the accompanying drawings, wherein.

DETAILED DESCRIPTION

A motor drive device according to the present invention will be described below with reference to the drawings. However, it should be noted that the technical scope of the present invention is not limited to these embodiments, but includes the invention as disclosed in the claims and its equivalents.

Figure 1:
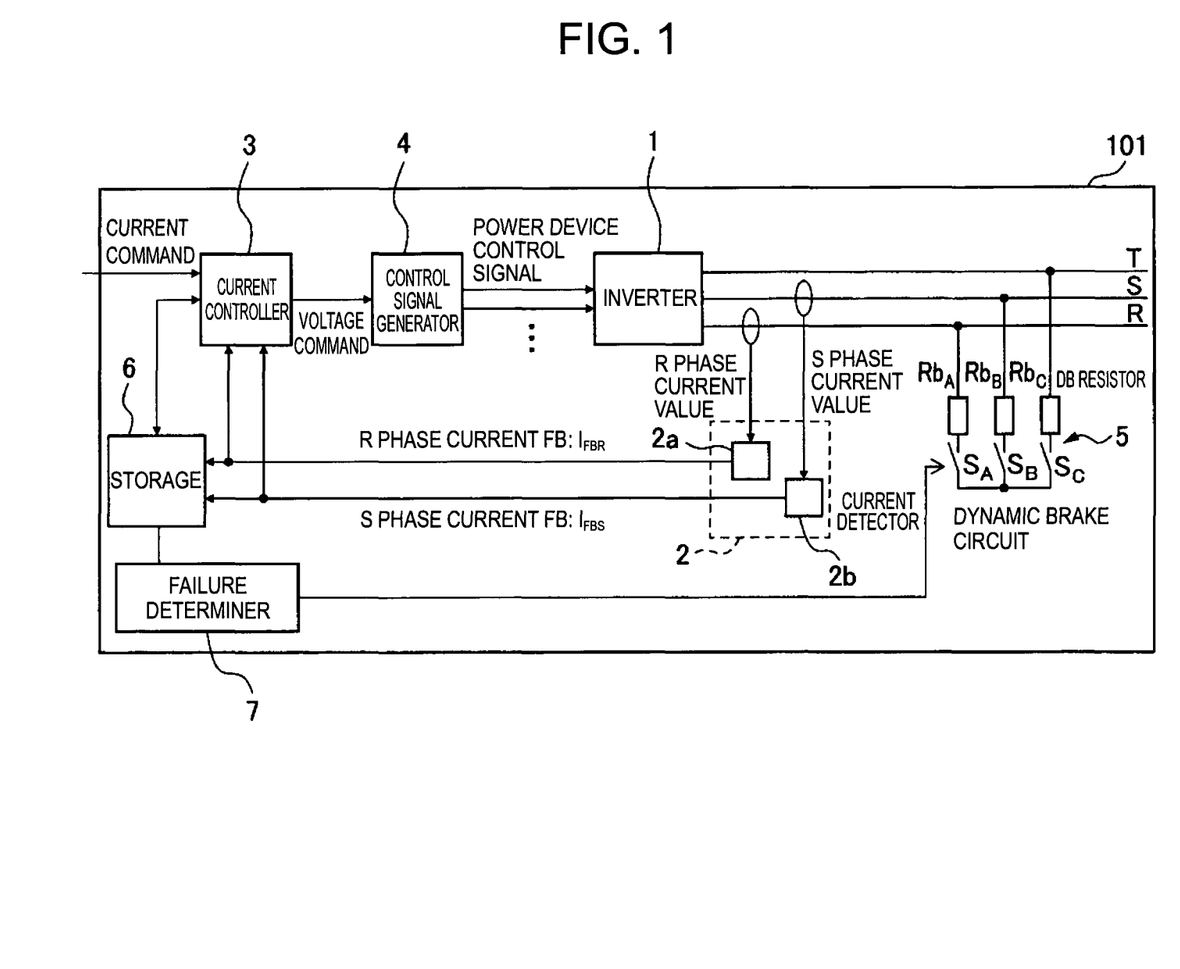
FIG. 1 is a block diagram illustrating a configuration of a motor drive device according to a first embodiment.

The motor drive device according to a first embodiment will be described. FIG. 1 illustrates a block diagram depicting a configuration of a motor drive device according to the first embodiment. The motor drive device 101 according to the first embodiment includes an inverter 1, a current detector 2, a current controller 3, a control signal generator 4, a dynamic brake circuit 5, a storage 6, and a failure determiner 7.

The inverter 1 includes a plurality of power devices (not illustrated), and converts a DC voltage into an AC voltage by switching the plurality of power devices. For example, the inverter 1 includes a power device on each of an upper arm and a lower arm, and converts a DC voltage into an AC voltage by switching the power devices. By closing the relays ($S_A$, $S_B$, $S_C$) of the dynamic brake circuit 5, the converted AC voltage is applied to the dynamic break resistances ($Rb_A$, $Rb_B$, $Rb_C$) connected to each relay, and the R phase current, the S phase current, and the T phase current flow to the dynamic break circuit 5. The DC voltage supplied to the inverter 1 can be obtained, for example, by converting an AC voltage supplied from an AC power supply (not illustrated) into a DC voltage by a rectifier, and smoothing the DC voltage with a smoothing capacitor. In the present embodiment, a case in a three-phase (R phase, S phase, T phase) inverter is used as the inverter 1 will be described as an example. In this case, for example, insulated gate bipolar transistors (IGBTs) can be used for the six power devices, and it is preferable to provide freewheeling diodes in antiparallel to these power devices.

The current detector 2 detects a current output from the inverter 1. In the example illustrated in FIG. 1, the current detector 2 includes a first current detector 2a configured to detect an R phase current and a second current detector 2b configured to detect an S phase current. However, such an example is not limiting, and the other two phase currents such as the R phase current and the T phase current may be detected, or three-phase currents may be detected. The R phase current $I_{FBR}$ which is the R phase current feedback (FB) detected by the first current detector 2a and the S phase current $I_{FBS}$ which is the S phase current feedback (FB) detected by the second current detector 2b are output to the current controller 3 and the storage 6.

The current controller 3 generates a voltage command based on the current command and the value of the current detected by the current detector 2. The current command is provided from outside of the motor drive device 101. The generated voltage command is output to the control signal generator 4.

The control signal generator 4 controls switching of the plurality of power devices of the inverter 1 based on the voltage command.

The dynamic brake circuit 5 includes a plurality of relays ($S_A$, $S_B$, $S_C$) configured to short circuit an output side terminal of the inverter 1 via a dynamic brake resistor which is a plurality of resistances ($Rb_A$, $Rb_B$, $Rb_C$). In the example illustrated in FIG. 1, since a three-phase motor drive device is exemplified, an example is illustrated in which the dynamic brake circuit 5 is provided with three dynamic brake (DB) resistors and three relays respectively, but this example is not limiting. In addition, the opening and closing of the plurality of relays ($S_A$, $S_B$, $S_C$) of the dynamic brake circuit 5 may be controlled by a control signal from the failure determiner 7.

The storage 6 is configured to store, when a current command is input to the current controller 3 and at least two relays from among the plurality of relays are caused to conduct, an initial current value which is an initial value of a current detected by the current detector 2 and a first threshold value for determining the presence or absence of a failure. In the motor drive device according to the present embodiment, the presence or absence of a failure is determined with reference to the initial current value, which is the initial value of the current output from the inverter 1. Accordingly, in a state in which two relays from among the plurality of relays of the dynamic brake circuit 5 are caused to conduct and a current flows in the dynamic brake circuit 5, the current value initially detected by the current detection circuit 2 when the inverter 1 is operated is set as the initial current value. The storage 6 stores the initial current value. For example, it is possible to cause the relays $S_A$ and $S_B$ of the dynamic brake circuit 5 to conduct, and set the initial value of the detected R phase current or S phase current as the initial current value. As the initial current value, the initial value of any one of the R phase current, the S phase current, or the T phase current may be used as the initial current value. This is because, in cases where the values of the plurality of dynamic brake resistances ($Rb_A$, $Rb_B$, $Rb_C$) are equal and no failure has occurred in the motor drive device, the values of each of the R phase current, the S phase current, and the T phase current can be considered to be equal. It should be noted that a method for determining whether the initial current value is normal will be described later.

The failure determiner 7 is configured to compare, after a predetermined time has elapsed since detection of the initial current value, a current value, which is a value of a current detected by the current detector 2 when a current command is input to the current controller 3 and at least two relays from among the plurality of relays are caused to conduct, and the initial current value. The failure determiner 7 determines the presence or absence of a failure based on the result of comparing the change rate of the current value from the initial current value with the first threshold value. "After a predetermined time has elapsed" means that it is not simultaneous with the detection of the initial current value. The "predetermined time" can be arbitrarily set according to the elapsed time at which failure of the motor drive device is estimated to occur. After a predetermined time has elapsed since detection of the initial current value, in a state in which at least two relays from among the plurality of relays of the dynamic brake circuit 5 are caused to conduct and a current flows in the dynamic brake circuit 5, the failure determiner 7 compares the current value detected by the current detection circuit 2 when the inverter 1 is operated with the initial current value stored in the storage 6.

In addition, the storage 6 further stores a second threshold value that is smaller than the first threshold value. The failure determiner 7 may determine a failure when the absolute value of the change rate is greater than or equal to the first threshold value, and issue a warning when the absolute value of the change rate is greater than or equal to the second threshold value. In general, it is estimated that the absolute value of the change rate from the initial current value of the detected current value increases with time. For this reason, by issuing a warning before the motor drive device is determined to have failed, it is possible to prevent failures in advance. Accordingly, it is preferable that a second threshold value smaller than the first threshold value be set in advance and stored in the storage 6, and a warning be issued when the absolute value of the change rate is greater than or equal to the second threshold value.

The failure determiner 7 may also be configured to cause the relays of at least two phases of the dynamic brake circuit 5 to conduct, detect the current value of one particular phase, and determine the presence or absence of a failure for the one particular phase based on a result of comparing a change rate of the detected current value of the one particular phase from the initial current value with the first threshold value. For example, the failure determiner 7 can determine the presence or absence of a failure based on the result of comparing the change rate of the detected R phase current value $I_{FBR}$ from the initial current value $I_{ini}$ with the first threshold value. In particular, when the absolute value of the change rate, which is the ratio of the difference between the R phase current value $I_{FBR}$ and the initial current value $I_{ini}$ ($I_{ini}-I_{FBR}$) with respect to the initial current value $I_{ini}$, is greater than or equal to the first threshold value $Th_1$, i.e., when Formula (1) below is satisfied, it may be determined that a failure has occurred in the path through which the R phase current of the motor drive device flows.

$$|(I_{ini}-I_{FBR})/I_{ini}| \geq Th_1 \tag{1}$$

The reason why the absolute value of the difference between the R phase current value $I_{FBR}$ and the initial current value $I_{ini}$ ($I_{ini}-I_{FBR}$) is used is that, as cases in which failure occurs, in addition to the cases where the detected current decreases due to disconnection, etc., the cases in which the detected current increases due to a short circuit, etc., are also possible.

Similarly in the case of generating warnings, when the absolute value of the change rate, which is the ratio of the difference between the R phase current value $I_{FBR}$ and the initial current value $I_{ini}$ ($I_{ini}-I_{FBR}$) with respect to the initial current value $I_{ini}$, is greater than or equal to the second threshold value $Th_2$ (<$Th_1$), i.e., when Formula (2) below is satisfied, a warning may be issued indicating that a failure may occur in the path through which the R phase current of the motor drive device flows.

$$|(I_{ini}-I_{FBR})/I_{ini}|Th_2 \qquad (2)$$

In the above description, an example was described in which attention was focused on the current of one phase, and generation of a warning or determination of the presence or absence of a failure was performed. However, generation of a warning or determination of the presence or absence of a failure may also be performed based on the detected currents of two phases. That is, the failure determiner 7 may be configured to cause the relays of at least two phases of the dynamic brake circuit 5 to conduct, detect current values of two particular phases, and determine the presence or absence of a failure based on a result of comparing a value obtained by dividing a difference between the detected current values of the two particular phases by a current value of one of the two particular phases with a third threshold value. In particular, when the absolute value of the change rate, which is the ratio of the difference between the R phase current value $I_{FBR}$ and the S phase current $I_{FBS}$ ($I_{FBR}-I_{FBS}$) with respect to the R phase current value $I_{FBR}$, is greater than or equal to the third threshold value $Th_3$, i.e., when Formula (3) below is satisfied, it may be determined that a failure has occurred in at least one of the paths through which the R phase current and the S phase current of the motor drive device flow.

$$|(I_{FBR}-I_{FBS})/I_{FBR}|=|1-I_{FBS}/I_{FBR}|\geq Th_3 \qquad (3)$$

It should be noted that, in the above explanation, although an example was described in which failures were detected by paying attention to the difference between the R phase current value $I_{FBR}$ and the S phase current $I_{FBS}$, a failure may be detected by paying attention to any two arbitrary currents from among the R phase current value, the S phase current, and the T phase current.

In the above description, an example was described in which generation of a warning or determination of the presence or absence of a failure was performed by comparing the detected current value with the initial current value or the current value of another phase. However, it is also possible to predict generation of a warning or determination of the presence or absence of a failure based on the temporal change of a detected current value. That is, the storage 6 may store the time when the current detection 2 detected the current value and the current value, and the failure determiner 7 may predict a timing of the failure based on the degree of temporal change of the current value.

Figure 2:
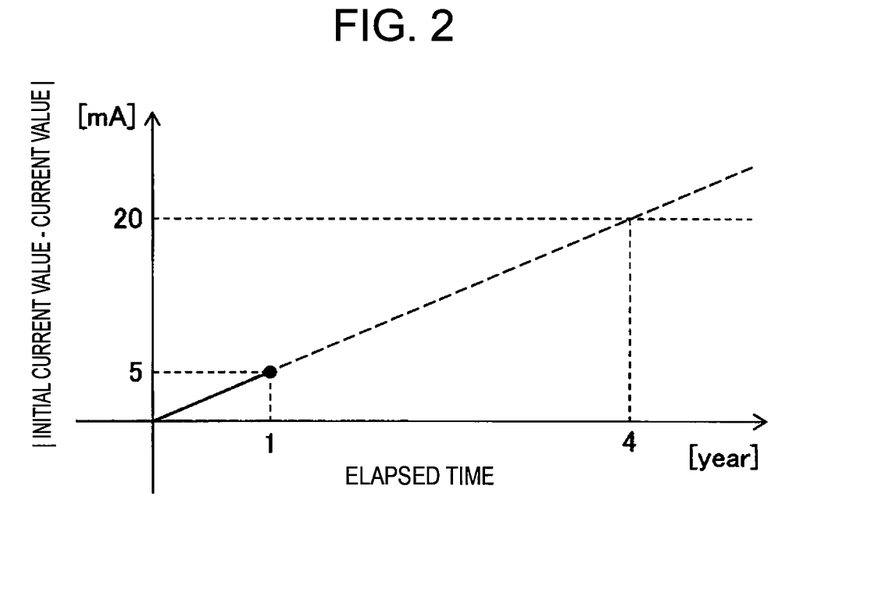
FIG. 2 is a graph illustrating an example of the temporal change in the absolute value of the difference between an initial current value and a detected current value in the motor drive device according to the first embodiment.

As an example of the temporal changes of the detected current values, the case about linear changing with time is considered. FIG. 2 illustrates an example of the temporal change of the absolute value of the difference between the initial current value and the detected current value in the motor drive device according to the first embodiment. For example, as illustrated in FIG. 2, in a case a failure is determined when the absolute value of the difference between the initial current value and the detected current value is 20 mA, assume the absolute value of the difference between a current value detected one year after the initial current value is detected and the initial current value to be 5 mA. In this case, since the absolute value of the difference between the initial current value and the detected current value will reach 20 mA four years after the initial current value is detected, it can be predicted that a failure will occur three years after a point in time when the absolute value of the difference between the detected current value and the initial current value is 5 mA.

Figure 3:
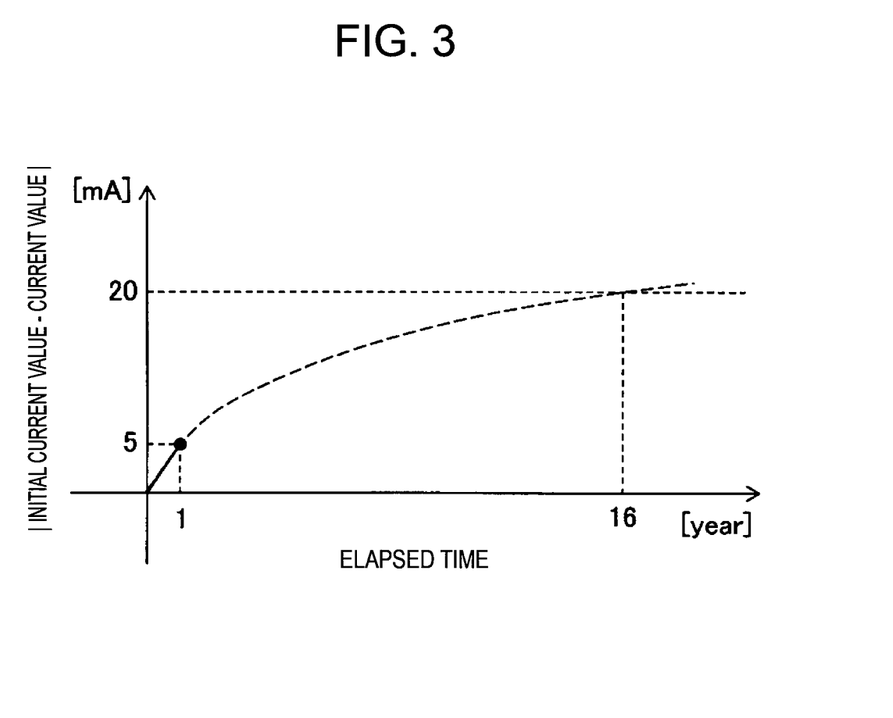
FIG. 3 is a graph illustrating another example of the temporal change in the absolute value of the difference between the initial current value and the detected current value in the motor drive device according to the first embodiment.

In addition, as an example of the temporal changes of the detected current values, the case about nonlinear changing with time is considered. FIG. 3 illustrates another example of the temporal change of the absolute value of the difference between the initial current value and the detected current value in the motor drive device according to the first embodiment. For example, as illustrated in FIG. 3, consider a case where the absolute value of the difference between the initial current value and the detected current value is proportional to the square root of the elapsed time. In cases that a failure is determined when the absolute value of the difference between the initial current value and the detected current value is 20 mA, assume that the absolute value of the difference between a current value detected one year after the initial current value is detected and the initial current value is 5 mA. In this case, since the absolute value of the difference between the initial current value and the detected current value will reach 20 mA sixteen years after the initial current value is detected, it can be predicted that a failure will occur fifteen years after the point in time when the absolute value of the difference between the detected current value and the initial current value is 5 mA.

In the above description, an example was described in which the initial current value is used as a reference when determining the presence or absence of a failure. In cases where the initial current value itself is an abnormal value, it becomes difficult to accurately determine the presence or absence of a failure. For this reason, it is important to verify that the initial current value is normal. Accordingly, it is preferable for the storage 6 to store the resistance values of the plurality of resistances ($Rb_A$, $Rb_B$, $RB_C$) of the dynamic brake circuit 5, and for the failure determiner 7 to determine whether the initial current value is abnormal based on the difference between an ideal current value calculated from the resistance values and the initial current value. The ideal current value can be calculated from the resistance values of the plurality of resistances ($Rb_A$, $Rb_B$, $RB_C$) of the dynamic brake circuit 5 and the applied voltage. In cases where the difference between the ideal current value and the initial current value exceeds an allowable range, the initial current value itself is considered to be abnormal. As a result, it is possible to prevent erroneously determining the presence or absence of a failure based on an abnormal initial current value when a power device has an initial defect, for example.

Figure 4:
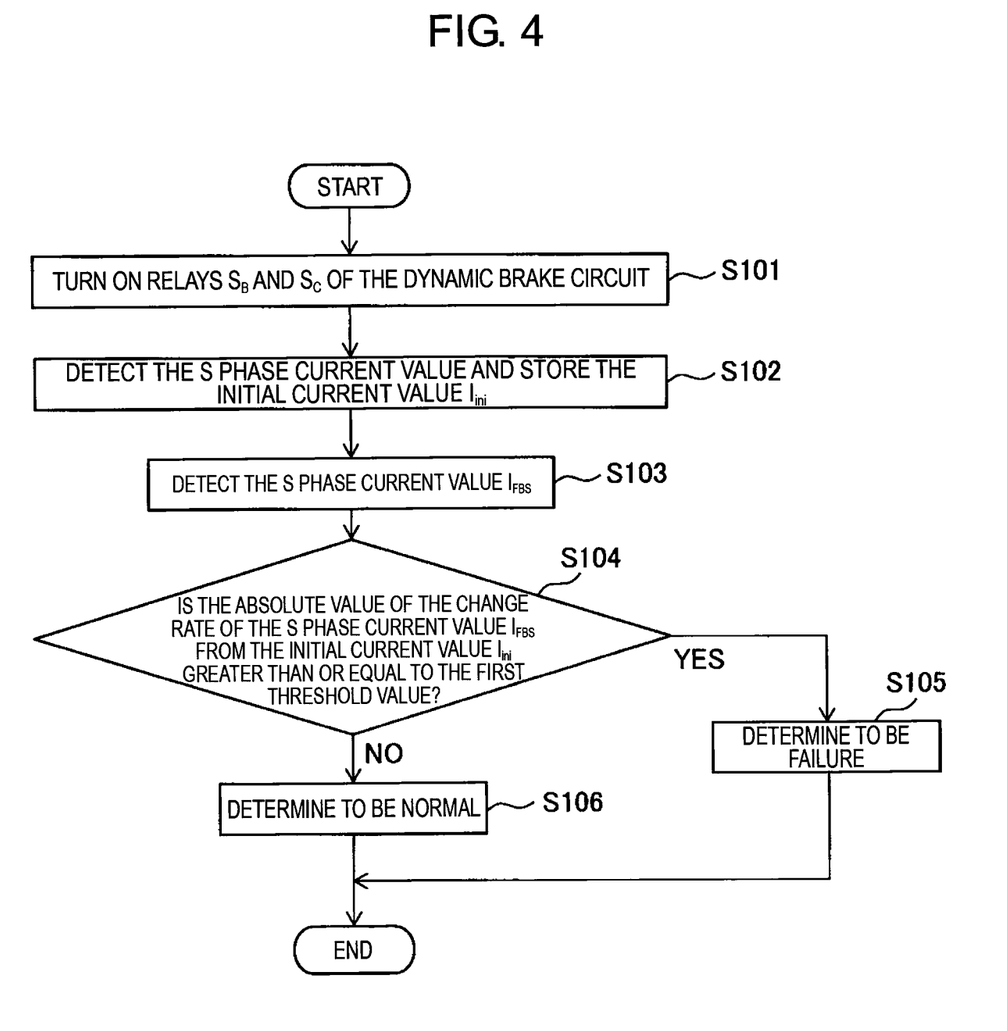
FIG. 4 is a flowchart for explaining a procedure for detecting a failure in the motor drive device according to the first embodiment.

Next, a procedure will be described for determining the presence or absence of a failure based on the current of one phase by using the motor drive device according to the first embodiment. FIG. 4 is a flowchart for explaining a procedure for detecting a failure in the motor drive device according to the first embodiment. In Step S101, the failure determiner 7 (see FIG. 1) turns on the relays $S_B$ and $S_C$ of the dynamic brake circuit 5.

Next, in Step S102, a current command is provided to the current controller 3, the S phase current value that flows by controlling the switching of the power devices of the inverter 1 is detected, and the initial current value $I_{ini}$ is stored in the storage 6. It should be noted that the storage 6 also stores a first threshold value for determining the presence or absence of a failure.

Next, in Step S103, after a predetermined time has elapsed since detection of the initial current value, a current command is provided to the current controller 3, and the S phase current value $I_{FBS}$ that flows by controlling the switching of the power devices of the inverter 1 is detected.

Next, in Step S104, it is determined whether the absolute value of the change rate of the S phase current value $I_{FBS}$ from the initial current value $I_{ini}$ is greater than or equal to the first threshold value.

In cases that the absolute value of the change rate of the S phase current value $I_{FBS}$ from the initial current value $I_{ini}$ is greater than or equal to the first threshold value, in Step S105, it is determined that a failure has occurred in the path of the S phase current of the motor drive device.

In contrast, in cases that the absolute value of the change rate of the S phase current value $I_{FBS}$ from the initial current value $I_{ini}$ is less than the first threshold value, in Step S106, it is determined that the path of the S phase current of the motor drive device is normal.

In the above description, an example was described in which the presence or absence of a failure is determined based on the S phase current. However, the presence or absence of a failure may be determined based on the R phase current or the T phase current.

Figure 5:
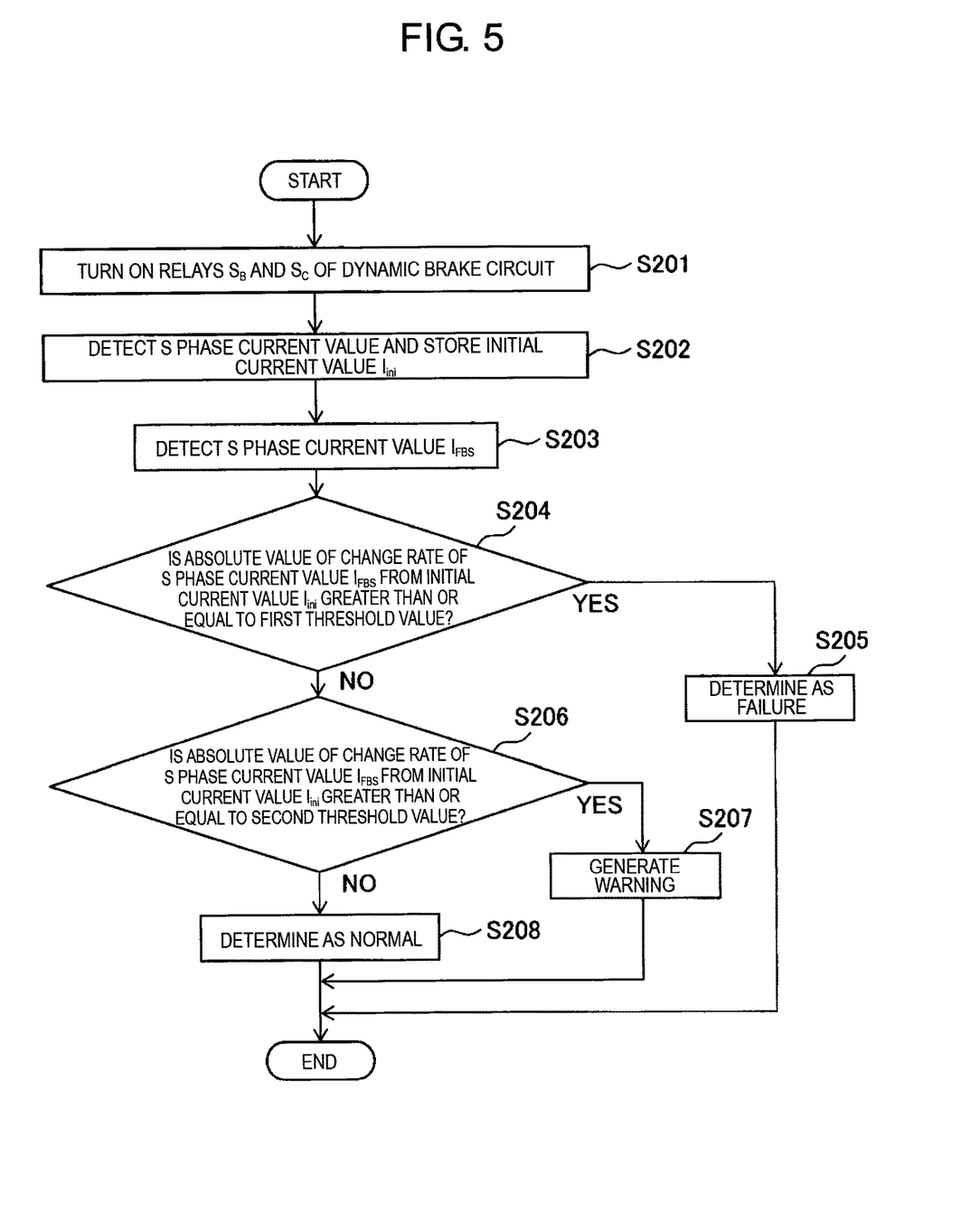
FIG. 5 is a flowchart for explaining a procedure for issuing a warning and detecting a failure in the motor drive device according to the first embodiment.

Next, a procedure will be described for determining the generation of a warning or the presence or absence of a failure based on the current of one phase by using the motor drive device according to the first embodiment. FIG. 5 is a flowchart for explaining a procedure for generating a warning and detecting a failure in the motor drive device according to the first embodiment. Steps S201 to S205 are steps for determining the presence or absence of a failure, and are the same as the above-mentioned steps S101 to S105, so a detailed description will be omitted herein. It should be noted that the storage 6 stores a first threshold value for determining the presence or absence of a failure and a second threshold value for determining whether generation of a warning is necessary.

In Step S204, in cases that the absolute value of the change rate of the S phase current value $I_{FBS}$ from the initial current value $I_{ini}$ is less than the first threshold value, in Step S206 and the following steps, it is determined whether a warning should be generated.

In Step S206, it is determined whether the absolute value of the change rate of the S phase current value $I_{FBS}$ from the initial current value $I_{ini}$ is greater than or equal to the second threshold value.

In cases that the absolute value of the change rate of the S phase current value $I_{FBS}$ from the initial current value $I_{ini}$ is greater than or equal to the second threshold value, in Step S207, a warning is generated indicating that a failure may occur in the path of the S phase current of the motor drive device.

In contrast, in cases that the absolute value of the change rate of the S phase current value $I_{FBS}$ from the initial current value $I_{ini}$ is less than the first threshold value, in Step S208, it is determined that the path of the S phase current of the motor drive device is normal.

In the above description, an example was described in which generation of a warning or determination of the presence or absence of a failure was performed based on the S phase current. However, generation of a warning or determination of the presence or absence of a failure may be performed based on the R phase current or the T phase current.

Figure 6:
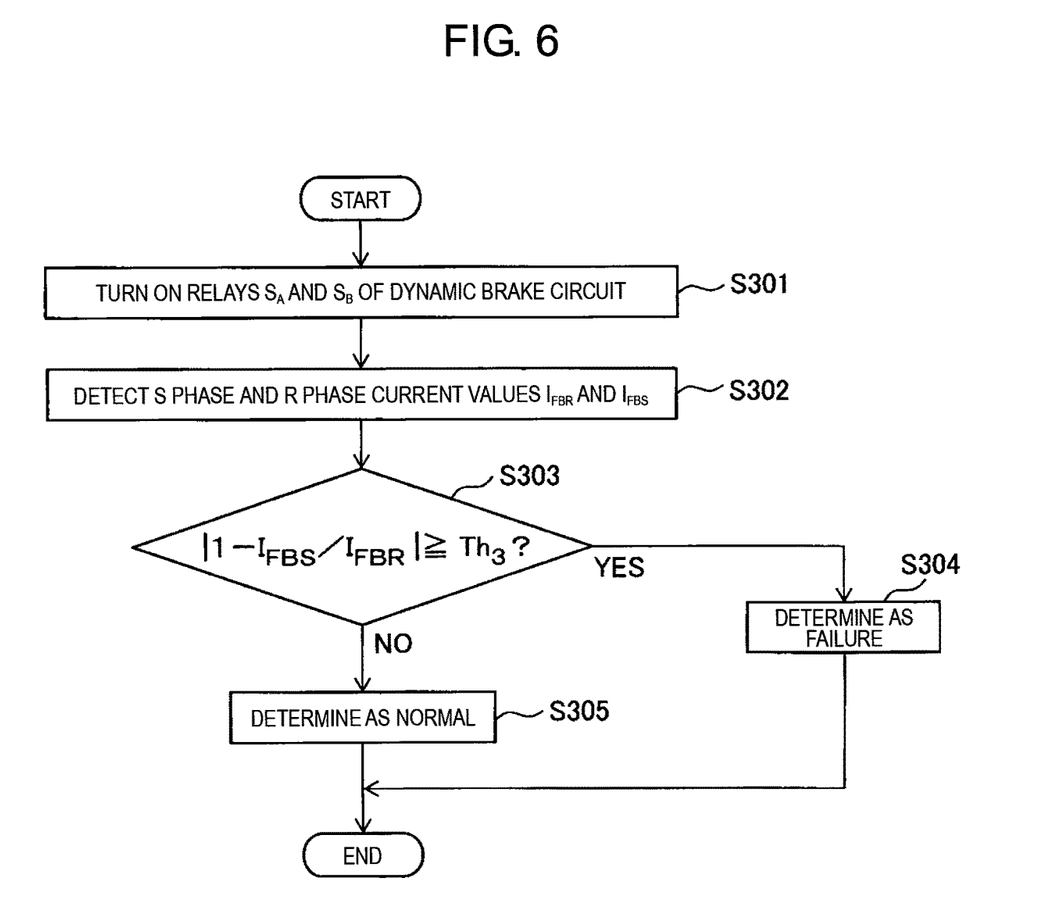
FIG. 6 is a flowchart for explaining a procedure for detecting a failure from current detection values of two phases in the motor drive device according to the first embodiment.

Next, a procedure will be described for determining the presence or absence of a failure based on the current of two phases by using the motor drive device according to the first embodiment. FIG. 6 is a flowchart for explaining a procedure for detecting a failure from current detection values of two phases in the motor drive device according to the first embodiment. In Step S301, the failure determiner 7 turns on the relays $S_A$ and $S_B$ of the dynamic brake circuit.

Next, in Step S302, a current command is provided to the current controller 3, and the S phase current value $I_{FBS}$ and the R phase current value $I_{FBR}$ that flow by controlling the switching of the power devices of the inverter 1 are detected. It should be noted that the storage 6 also stores a third threshold value $Th_3$ for determining the presence or absence of a failure.

Next, in Step S303, it is determined whether the absolute value of the change rate, which is the ratio of the difference between the R phase current value $I_{FBR}$ and the S phase current $I_{FBS}$ ($I_{FBR}-I_{FBS}$) with respect to the R phase current value $I_{FBR}$, is greater than or equal to the third threshold value $Th_3$, i.e., whether the above mentioned Formula (3) is satisfied.

In cases that the absolute value of the ratio of the difference ($I_{FBR}-I_{FBS}$) with respect to the R phase current value $I_{FBR}$ is greater than or equal to the third threshold value $Th_3$, then in Step S304, it is determined that a failure has occurred in at least one of the paths of the S phase current or the R phase current of the motor drive device.

In contrast, in cases that the absolute value of the ratio of the difference ($I_{FBR}-I_{FBS}$) with respect to the R phase current value $I_{FBR}$ is less than the third threshold value $Th_3$, then in Step S305, it is determined that the paths of the S phase current and the R phase current of the motor drive device are normal.

In the above description, an example was described in which the presence or absence of a failure is determined based on a combination of the S phase current and the R phase current. However, the presence or absence of a failure may be determined based on a combination of an R phase current and a T phase current, or a combination of a T phase current and an S phase current.

As described above, according to the motor drive device of the first embodiment, it is possible to determine the presence or absence of a failure even for a motor drive device alone, not being connected with a motor.

Figure 7:
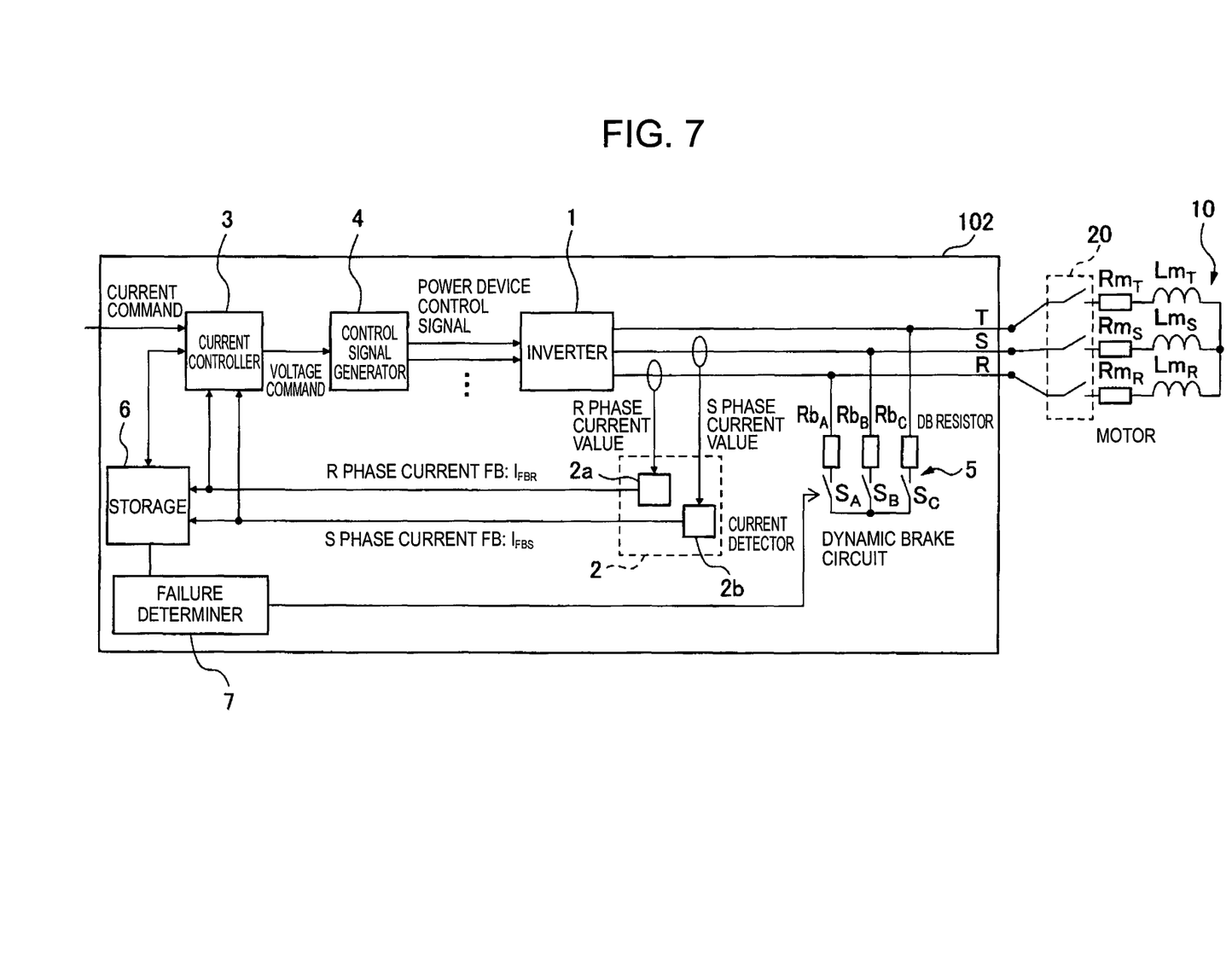
FIG. 7 is a block diagram illustrating the configuration of a motor drive device according to a second embodiment.

Next, a motor drive device according to a second embodiment will be described. FIG. 7 illustrates a block diagram depicting the configuration of a motor drive device according to the second embodiment. The motor drive device 102 according to the second embodiment is different from the motor drive device 101 according to the first embodiment in that it further includes a switch 20 for connecting or disconnecting the motor 10 to an output side terminal of the inverter 1. As the other configurations of the motor drive device 102 according to the second embodiment are similar to those of the motor drive device 101 according to the first embodiment, a detailed description thereof will be omitted herein.

As illustrated in FIG. 7, the motor 10 can be approximated by a plurality of resistances ($Rm_R$, $Rm_S$, $Rm_T$) and a plurality of inductances ($Lm_R$, $Lm_S$, $Lm_T$). The switch 20 allows the motor 10 be connected to or disconnected from the motor drive device 102.

As inductances ($Lm_R$, $Lm_S$, $Lm_T$) are included in the motor 10, it is possible to determine whether the motor 10 is connected to the motor drive circuit 102 based on the temporal change in the current flowing through the motor 10. That is, when the motor 10 is not connected to the motor drive circuit 102, the detected current is constant. In contrast to this, when the motor 10 is connected to the motor drive circuit 102, the current increases with time at a particular slope depending on the inductances ($Lm_R$, $Lm_S$, $Lm_T$) of the motor 10. It is preferable that the value of the slope of the current for determining whether the motor 10 is connected to the motor drive circuit 102 is stored in advance in the storage 6.

When the switch 20 is turned off and the motor 10 is disconnected from the motor drive device 102, the presence or absence of a failure of the motor drive device 102 can be determined in the same manner as in the first embodiment. In contrast, when the switch 20 is turned on and the motor 10 is connected to the motor drive device 102, it is possible to determine whether at least one of the motor 10 or the motor drive device 102 has a failure. In cases where the switch 20 is initially turned off, the presence or absence of a failure of the motor drive device 102 is determined, and it is found that the motor drive device 102 is normal, by subsequently turning on the switch 20 to determine the presence or absence of a failure, it is possible to determine the presence or absence of a failure only in the motor 10.

As described above, according to the motor drive device of the second embodiment, it is possible to determine which one of the motor or the motor drive device has failed by determining the presence or absence of a failure while turning the switch 20 on and off.

According to the motor drive device according to an embodiment of the present disclosure, it is possible to detect a failure without actually operating the motor, and furthermore, failure detection can be performed by the motor drive device alone even when the motor is not connected to the motor drive device.

What is claimed is:

1. A motor drive device comprising:
    an inverter provided with a plurality of power devices and configured to convert a DC voltage to an AC voltage by switching the plurality of power devices;
    a current detector configured to detect a current output from the inverter;
    a current controller configured to generate a voltage command based on a current command and a value of the current detected by the current detector;
    a control signal generator configured to control switching of the plurality of power devices of the inverter based on the voltage command;
    a dynamic brake circuit provided with a plurality of relays and configured to short-circuit an output side terminal of the inverter via a plurality of resistances;
    a storage configured to store, when a current command is input to the current controller and at least two relays from among the plurality of relays are caused to conduct, an initial current value being an initial value of a current detected by the current detector and a first threshold value for determining presence or absence of a failure; and
    a failure determiner configured to compare, after a predetermined time has elapsed since detection of the initial current value, a current value and the initial current value, and determine presence or absence of a failure in the motor drive device without the motor drive device being connected with a motor based on a result of comparing a change rate of the current value from the initial current value with the first threshold value,
    wherein the current value is a value of a current detected by the current detector when a current command is input to the current controller and at least two relays from among the plurality of relays are caused to conduct.

2. The motor drive device according to claim 1,
    wherein the storage is further configured to store a second threshold value smaller than the first threshold value, and
    wherein the failure determiner is configured to:
        determine a failure when an absolute value of the change rate is greater than or equal to the first threshold value; and
        issue a warning when an absolute value of the change rate is greater than or equal to the second threshold value.

3. The motor drive device according to claim 1,
    wherein the storage is configured to store a time, when the current detector detected the current value, and the current value, and
    wherein the failure determiner is configured to predict a timing of the failure based on a degree of temporal change of the current value.

4. The motor drive device according to claim 1,
    wherein the storage is configured to store each resistance value of the plurality of resistances of the dynamic brake circuit, and
    wherein the failure determiner is configured to determine, based on a difference between the initial current value and an ideal current value calculated from the resistance value, whether the initial current value is abnormal.

5. The motor drive device according to claim 1,
    wherein the failure determiner is configured to cause the relays of at least two phases of the dynamic brake circuit to conduct, detect a current value of one particular phase, and determine presence or absence of a failure for the one particular phase based on a result of comparing a change rate of the detected current value of the one particular phase from the initial current value with the first threshold value.

6. The motor drive device according to claim 1,
    wherein the failure determiner is configured to cause the relays of at least two phases of the dynamic brake circuit to conduct, detect current values of two particular phases, and determine presence or absence of a failure based on a result of comparing a value, obtained by dividing a difference between the detected current values of the two particular phases by a current value of one phase, with a third threshold value.

7. The motor drive device according to claim 1, further comprising:
    a switch configured to connect or disconnect a motor from an output side terminal of the inverter.

* * * * *